US009496253B2

(12) United States Patent
Ma et al.

(10) Patent No.: US 9,496,253 B2
(45) Date of Patent: Nov. 15, 2016

(54) MINIATURE PASSIVE STRUCTURES, HIGH FREQUENCY ELECTROSTATIC DISCHARGE PROTECTION NETWORKS, AND HIGH FREQUENCY ELECTROSTATIC DISCHARGE PROTECTION SCHEMES

(71) Applicant: Nanyang Technological University, Singapore (SG)

(72) Inventors: Kai Xue Ma, Singapore (SG); Keping Wang, Singapore (SG); Kiat Seng Yeo, Singapore (SG)

(73) Assignee: Nanyang Technological University, Singapore (SG)

( * ) Notice: Subject to any disclaimer, the term of this patent is extended or adjusted under 35 U.S.C. 154(b) by 0 days.

(21) Appl. No.: 14/369,937

(22) PCT Filed: Dec. 31, 2012

(86) PCT No.: PCT/SG2012/000494
§ 371 (c)(1),
(2) Date: Jun. 30, 2014

(87) PCT Pub. No.: WO2013/100861
PCT Pub. Date: Jul. 4, 2013

(65) Prior Publication Data
US 2015/0145098 A1     May 28, 2015

(30) Foreign Application Priority Data
Dec. 30, 2011    (SG) .................................. 201109767

(51) Int. Cl.
H01L 27/02    (2006.01)
H01L 23/60    (2006.01)
H01L 23/66    (2006.01)

(52) U.S. Cl.
CPC .......... *H01L 27/0288* (2013.01); *H01L 23/60* (2013.01); *H01L 23/66* (2013.01); *H01L 2223/6627* (2013.01); *H01L 2924/0002* (2013.01)

(58) Field of Classification Search
CPC .................. H01L 2924/00; H01L 2924/0002; H01L 2924/3011
(Continued)

(56) References Cited

U.S. PATENT DOCUMENTS 6,885,275 B1 * 4/2005 Chang ................. H01F 17/0006
257/531
7,224,180 B2 * 5/2007 Hargrove ................ H01L 23/60
326/26
(Continued)

OTHER PUBLICATIONS

Examination Report dated Nov. 5, 2015 from Singapore patent application No. 11201403720V.

*Primary Examiner* — David Vu
*Assistant Examiner* — Jonathan Han
(74) *Attorney, Agent, or Firm* — K. David Crockett, Esq.; Niky Economy Syrengelas, Esq.; Crockett & Crockett, PC

(57) ABSTRACT

According to various embodiments, a miniature passive structure for electrostatic discharge protection and input/output matching for a high frequency integrated circuit may be provided. The structure may include: either a transmission line or an inductor for providing at least one electrostatic discharge path; and a capacitor with a first end connected to the transmission line or inductor and a second end connected to ground.

5 Claims, 10 Drawing Sheets

(58) Field of Classification Search
USPC .............. 361/56; 257/531, E21.477, E23.01, 257/E23.141, 173
See application file for complete search history.

(56) References Cited

U.S. PATENT DOCUMENTS

| | | | |
|---|---|---|---|
| 2004/0080881 A1* | 4/2004 | Chou | H02H 9/046 361/56 |
| 2005/0063129 A1* | 3/2005 | Kato | H02H 9/046 361/212 |
| 2007/0263330 A1* | 11/2007 | Knapp | H02H 9/046 361/56 |
| 2008/0112101 A1 | 5/2008 | McElwee et al. | |
| 2009/0185317 A1* | 7/2009 | Dijkhuis | H01L 27/0248 361/56 |
| 2009/0189182 A1* | 7/2009 | Hodel | H01L 23/60 257/173 |
| 2011/0038087 A1* | 2/2011 | Moronval | H01L 27/0248 361/111 |

* cited by examiner

MINIATURE PASSIVE STRUCTURES, HIGH FREQUENCY ELECTROSTATIC DISCHARGE PROTECTION NETWORKS, AND HIGH FREQUENCY ELECTROSTATIC DISCHARGE PROTECTION SCHEMES

CROSS-REFERENCE TO RELATED APPLICATIONS

The present application claims the benefit of the Singapore patent application No. 201109767-2 filed on 30 Dec. 2011, the entire contents of which are incorporated herein by reference for all purposes.

TECHNICAL FIELD

Embodiments relate generally to miniature passive structures for electrostatic discharge protection and input/output matching for a high frequency integrated circuit, high frequency electrostatic discharge protection networks for integrated circuits, and high frequency electrostatic discharge protection schemes for integrated circuits.

BACKGROUND

Electro-static discharge represents a single-event, rapid transfer of electrostatic charge between two objects, usually resulting when two objects at different potentials caused by static charge accumulation. ESD can also occur when a high electro-static field develops between two objects in close proximity. There are three predominant ESD models for integrated circuits: 1) the Human Body Model (HBM); 2) the Charged Device Model (CDM); and 3) the Machine Model (MM). HBM and CDM are considered to be more "real world" models than the MM. An integrated circuit is susceptible to ESD strikes during fabrication, testing, packaging, transportation etc. ESD is leading cause of electrical overstress and resultant irreversible damage in integrated circuits.

SUMMARY

According to various embodiments, a miniature passive structure for electrostatic discharge protection and input/output matching for a high frequency integrated circuit may be provided. The structure may include: a transmission line for providing at least one electrostatic discharge path; and a capacitor with a first end connected to the transmission line and a second end connected to ground.

According to various embodiments, a miniature passive structure for electrostatic discharge protection and input/output matching for a high frequency integrated circuit may be provided. The structure may include: an inductor for providing at least one electrostatic discharge path; and a capacitor with a first end connected to the inductor and a second end connected to ground.

According to various embodiments, a high frequency electrostatic discharge protection network for integrated circuits may be provided. The network may include: a high frequency signal carrying transmission line; and one or more miniature passive structures. Each of the one or more miniature passive structures may include: a transmission line for providing a corresponding at least one electrostatic discharge path; and a capacitor with a first end connected to the transmission line and a second end connected to ground. The integrated circuits are based on an integrated circuit technology selected from the group consisting of CMOS, GaAs, SiGe, and InP.

According to various embodiments, a high frequency electrostatic discharge protection network for integrated circuits may be provided. The network may include: a high frequency signal carrying transmission line; and one or more miniature passive structures. Each of the one or more miniature passive structures may include: an inductor for providing a corresponding at least one electrostatic discharge path; and a capacitor with a first end connected to the inductor and a second end connected to ground. The integrated circuits may be based on an integrated circuit technology selected from the group consisting of CMOS, GaAs, SiGe, and InP.

According to various embodiments, a high frequency electrostatic discharge protection scheme for integrated circuits may be provided. The scheme may include: power supply rails; a supply clamp, providing transient clamping of the electrical potential difference between the power supply rails; and a high frequency electrostatic discharge protection network including: a transmission line for providing at least one electrostatic discharge path; and a capacitor with a first end connected to the transmission line and a second end connected to ground.

According to various embodiments, a high frequency electrostatic discharge protection scheme for integrated circuits may be provided. The scheme may include: power supply rails; a supply clamp, providing transient clamping of the electrical potential difference between the power supply rails; and a high frequency electrostatic discharge protection network including: an inductor for providing at least one electrostatic discharge path; and a capacitor with a first end connected to the inductor and a second end connected to ground.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments are described with reference to the following drawings, in which.

DESCRIPTION

Figure 1:
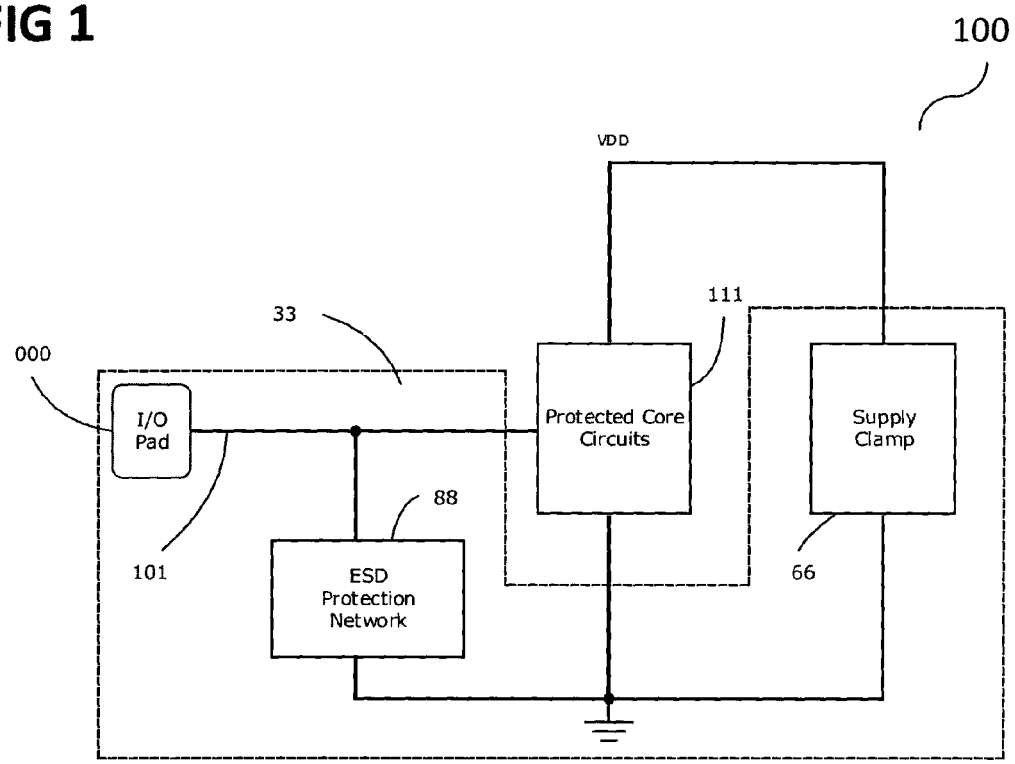
FIG. 1 shows an electro-static discharge (ESD) protection network in accordance with an embodiment.

Furthermore, it will be understood that the embodiments described below may be combined, for example, a part of one embodiment may be combined with a part of another embodiment.

The terms "coupled" or "connected" or "coupling" or "connection" are to be understood to embrace both a direct "coupling" or "connection" and an indirect "coupling" or "connection" (in other words: a connection or coupling between A and B may be understood as A directly connected or coupled to B, or as A being connected or coupled to B via C).

According to various embodiments, ultra-wideband ESD protection for RFIC (radio-frequency integrated circuits) may be provided.

Miniature passive and lumped-element circuits and dedicated RF pads may be employed to implement electro-static discharge (ESD) protection as well as input/output (I/O) port matching for radio-frequency (RF), microwave and millimeter-wave integrated circuits (IC) and systems. The miniature ESD structures and ESD pads according to various embodiments may efficiently bypass the deteriorating ESD current, while may make ultra-wide RF signal pass through with low insertion loss. By adjusting the available design variables, such as the shape, physical dimension, positioning of the miniature passive structures, the ESD protection circuits according to various embodiments may be designed purposely to exhibit certain shunt impedance to be acting as matching elements in the input and output network of the circuit under protection, further reducing the size of the integrated circuits.

Electro-static discharge may represent a single-event, rapid transfer of electrostatic charge between two objects, usually resulting when two objects at different potentials caused by static charge accumulation. ESD may also occur when a high electro-static field develops between two objects in close proximity. There are three predominant ESD models for integrated circuits: 1) the Human Body Model (HBM); 2) the Charged Device Model (CDM); and 3) the Machine Model (MM). HBM and CDM may be considered to be more "real world" models than the MM. An integrated circuit may be susceptible to ESD strikes during fabrication, testing, packaging, transportation etc. ESD is leading cause of electrical overstress and resultant irreversible damage in integrated circuits.

The operation frequency may be increased rapidly by continuous scaling of integrated circuits. The excessive parasitic effect in the conventional ESD protection methods has made ESD circuit a major bottleneck for high frequency and high speed operation, leaving a very stringent design trade-off between the IC's performance and reliability. Conventional ESD methods for integrated circuits may use devices such as diodes, silicon-controlled rectifiers (SCRs), grounded-gate n-channel MOSFETs (metal-oxide-semiconductor field-effect transistor; ggNMOSs, wherein NMOS may stand for N-type metal-oxide-semiconductor). In low frequency narrow-band designs, the parasitic impedance may be resonated out with a package or bond wire inductance, and thereby be circumvented. However, this approach may not be suitable for high frequency wideband analog and digital RF, microwave and millimeter-wave designs. The distributed effects of those conventional protection structures may become significant, and even slight non-uniformities in the via placement in ESD structures may cause severe performance degradation.

An ESD protection device for the protection of MOS (metal-oxide-semiconductor) circuits from high ESD voltages by arranging an N-well or very short length in a P-well or P-substrate may be introduced as high frequency low capacitance ESD device. The junction capacitance of this N-well may be low and in the order of 0.03 pF. However, in the mm-wave regime, the signal may be greatly attenuated by this capacitance. A topology of distributed ESD protection devices may be used to absorb the parasitic effects of the protection devices in a transmission line. Transmission lines may be employed to exhibits certain desirable impedance to the high frequency signal while bypass the ESD current to ESD protection devices or ground. An on-pad broadband matching network may be introduced as wideband matching technology as well as ESD protection. There may be a need for an improved ESD protection device or structures with an ESD protection without sacrificing the impedance matching in the RF, microwave, and millimeter-wave regime.

In RF, microwave, millimeter-wave ESD protection, passive type of ESD protection structures may be provided. These ESD protection structures may implement the ESD discharge path by intentionally introducing a shunt transmission line stub with ground termination. At high operation frequencies, the impedance looking into the shunt stub may be designed to be sufficient to avoid signal leakage to ground. While on the other hand, the shunt impedance may be low at lower frequencies and the low frequency signals including the ESD discharge current may be efficiently shunted to ground. To achieve sufficient impedance at the interested frequency band, the shunt stub may be desired to exhibit certain electrical length, through which the low impedance at its ground termination end can be transformed to high impedance. Typically, an electrical length of around a quarter wave length may be desired to accomplish such impedance transformation. Hence, the ESD protection structure for high-frequency I/O ports may be reported to have relatively large sizes and insertion losses, making the implementation of these passive ESD protection structures on commercial process technologies, such as CMOS (Complementary Metal Oxide Semiconductor), SiGe BiCMOS, GaAs, not much attractive.

According to various embodiments, an Ultra-Wideband ESD Protection for RFIC may be provided for the applications in CMOS, SiGe BiCMOS, GaAs and other integrated circuit process technologies. The transmission lines, loaded transmission line, lumped-element and wideband ESD protection pads type of ESD protection circuits may be introduced. According to various embodiments, the ESD protection structures may have ultra-wide RF bandwidth, compact size and low insertion loss, which may save cost and may improve performance of the integrated circuits simultaneously. Simultaneously, the ESD protection circuits according to various embodiments may have I/O matching (impedance matching in the input and output ports between the active and passive devices) capability. Especially, the developed ESD protection pads, which may have similar size to the normal non ESD protected RF pads but provide ESD protection and matching capability, may also be provided based on the proposed ESD protection concept. They may have a good potential to be widely adopted in the high-frequency IC products.

According to various embodiments, a miniature passive structure for electrostatic discharge protection and input/output matching for a high frequency integrated circuits may be provided. The structure may include: a transmission line for providing at least one electrostatic discharge path; and a capacitor with a first end connected to the transmission line and a second end connected to ground.

According to various embodiments, the transmission line may have a length of about ¼ wavelength, where the wavelength is a wave length of a certain transmission line (like a microstrip or a coplanar waveguide) on a certain substrate.

According to various embodiments, the miniature passive structure may further include an input signal trace, wherein the transmission line is DC connected to the input signal trace at a first end and DC connected to the capacitor at a second end.

According to various embodiments, the miniature passive structure may further include: an input signal trace, wherein the transmission line is DC connected to the input signal trace at a first end and AC coupled or DC connected to a supply rail at a second end.

According to various embodiments, the transmission line may include or may be at least one of a high impedance loaded transmission line or an unloaded transmission line (in other words: may be or may include a loaded transmission line and/or an unloaded transmission line and/or a high impedance loaded transmission line and/or a high impedance unloaded transmission line).

According to various embodiments, the transmission line may include or may be a high impedance transmission line. The high impedance transmission line may include or may be at least one of (i) a coplanar waveguide, (ii) a conductor backed coplanar waveguide, (iii) coax transmission lines, (iv) a microstrip line, or (v) a stripline.

According to various embodiments, a miniature passive structure for electrostatic discharge protection and input/output matching for a high frequency integrated circuit may be provided. The structure may include: an inductor for providing at least one electrostatic discharge path; and a capacitor with a first end connected to the inductor and a second end connected to ground.

According to various embodiments, the inductor may include or may be at least one of a single ended inductor, a differential symmetrical inductor, a multilayer stacked inductor or an inductor from the IC foundry.

According to various embodiments, the miniature passive structure may further include: an input signal trace, wherein the inductor is DC connected to the input signal trace at a first end and DC connected to the capacitor at a second end.

According to various embodiments, the miniature passive structure may further include: an input signal trace, wherein the inductor is DC connected to the input signal trace at a first end and AC coupled or DC connected to a supply rail at a second end.

According to various embodiments, a high frequency electrostatic discharge protection network for integrated circuits may be provided. The network may include: a high frequency signal carrying transmission line; and one or more miniature passive structures. Each of the one or more miniature passive structures may include: a transmission line for providing a corresponding at least one electrostatic discharge path; and a capacitor with a first end connected to the transmission line and a second end connected to ground. The integrated circuits are based on an integrated circuit technology selected from the group consisting of CMOS, GaAs, SiGe, and InP.

According to various embodiments, the high frequency electrostatic discharge protection network may be coupled to core circuits of the integrated circuits by capacitive coupling selected from the group consisting of capacitor coupling and coupled transmission line coupling for one or more of protection of the core circuits and DC bias of the core circuits.

According to various embodiments, the high frequency electrostatic discharge protection network may be coupled to core circuits of the integrated circuits by direct connection for protection of the core circuits.

According to various embodiments, a differential configuration of the high frequency ESD protection network may provide electrostatic discharge protection for differential input/output ports.

According to various embodiments, the high frequency electrostatic discharge protection network may further include: a plurality of electrostatic discharge paths wherein cascading of the high frequency electrostatic discharge protection network distributes electrostatic discharge current into multiple ones of the plurality of electrostatic discharge paths.

According to various embodiments, the high frequency electrostatic discharge protection network may act as an element in an input/output matching network.

According to various embodiments, a high frequency electrostatic discharge protection network for integrated circuits may be provided. The network may include: a high frequency signal carrying transmission line; and one or more miniature passive structures. Each of the one or more miniature passive structures may include: an inductor for providing a corresponding at least one electrostatic discharge path; and a capacitor with a first end connected to the inductor and a second end connected to ground. The integrated circuits may be based on an integrated circuit technology selected from the group consisting of CMOS, GaAs, SiGe, and InP.

According to various embodiments, the high frequency electrostatic discharge protection network may be coupled to core circuits of the integrated circuits by capacitive coupling selected from the group consisting of capacitor coupling and coupled transmission line coupling for one or more of protection of the core circuits and DC bias of the core circuits.

According to various embodiments, the high frequency electrostatic discharge protection network may be coupled to core circuits of the integrated circuits by direct connection for protection of the core circuits.

According to various embodiments, a differential configuration of the high frequency ESD protection network may provide electrostatic discharge protection for differential input/output ports.

According to various embodiments, the high frequency electrostatic discharge protection network may further include: a plurality of electrostatic discharge paths wherein cascading of the high frequency electrostatic discharge protection network distributes electrostatic discharge current into multiple ones of the plurality of electrostatic discharge paths.

According to various embodiments, the high frequency electrostatic discharge protection network may act as an element in an input/output matching network.

According to various embodiments, a high frequency electrostatic discharge protection scheme for integrated circuits may be provided. The scheme may include: power supply rails; a supply clamp, providing transient clamping of the electrical potential difference between the power supply rails; and a high frequency electrostatic discharge protection network including: a transmission line for providing at least one electrostatic discharge path; and a capacitor with a first end connected to the transmission line and a second end connected to ground.

According to various embodiments, the high frequency electrostatic discharge protection scheme may further include an input/output (I/O) pin. The power supply rails may include or may be a positive power supply rail and a negative power supply rail. The high frequency electrostatic discharge protection scheme may provide electrostatic discharge stress for the integrated circuits, the electrostatic discharge stress selected from the group consisting of (a) positive electrostatic discharge stress at the I/O pin with reference to the negative power supply rail, (b) negative ESD stress at the I/O pin with reference to the negative power supply rail, (c) positive ESD stress at the I/O pin with reference to the positive power supply rail, (d) negative ESD stress at the I/O pin with reference to the positive power supply rail, (e) positive electrostatic discharge stress at the positive power supply rail with reference to the negative power supply rail, and (f) negative electrostatic discharge stress at the positive power supply rail with reference to the negative power supply rail.

According to various embodiments, a high frequency electrostatic discharge protection scheme for integrated circuits may be provided. The scheme may include: power supply rails; a supply clamp, providing transient clamping of the electrical potential difference between the power supply rails; and a high frequency electrostatic discharge protection network including: an inductor for providing at least one electrostatic discharge path; and a capacitor with a first end connected to the inductor and a second end connected to ground.

According to various embodiments, the high frequency electrostatic discharge protection scheme may further include an input/output (I/O) pin. The power supply rails may include or may be a positive power supply rail and a negative power supply rail. The high frequency electrostatic discharge protection scheme may provide electrostatic discharge stress for the integrated circuits, the electrostatic discharge stress selected from the group consisting of (a) positive electrostatic discharge stress at the I/O pin with reference to the negative power supply rail, (b) negative ESD stress at the I/O pin with reference to the negative power supply rail, (c) positive ESD stress at the I/O pin with reference to the positive power supply rail, (d) negative ESD stress at the I/O pin with reference to the positive power supply rail, (e) positive electrostatic discharge stress at the positive power supply rail with reference to the negative power supply rail, and (f) negative electrostatic discharge stress at the positive power supply rail with reference to the negative power supply rail.

Figure 5:
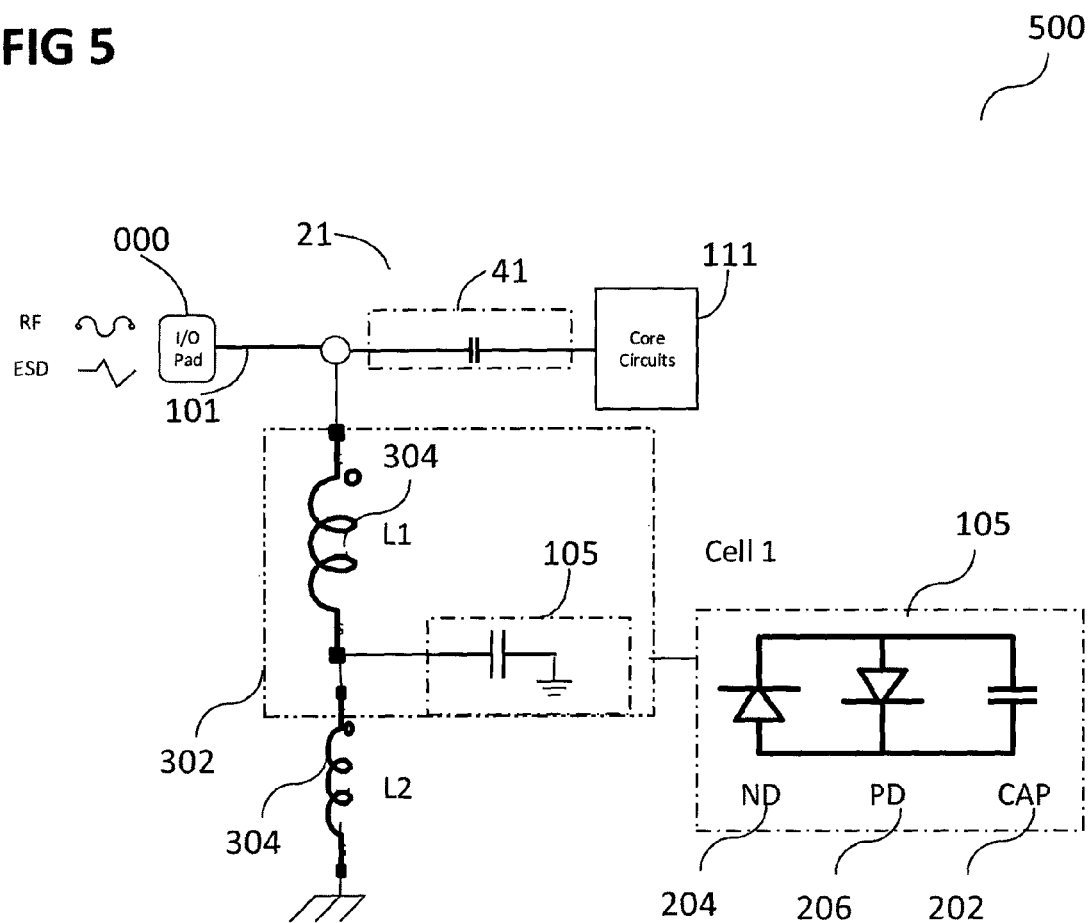
FIG. 5 shows a lumped-element type ESD protection network in accordance with an embodiment.
Figure 6:
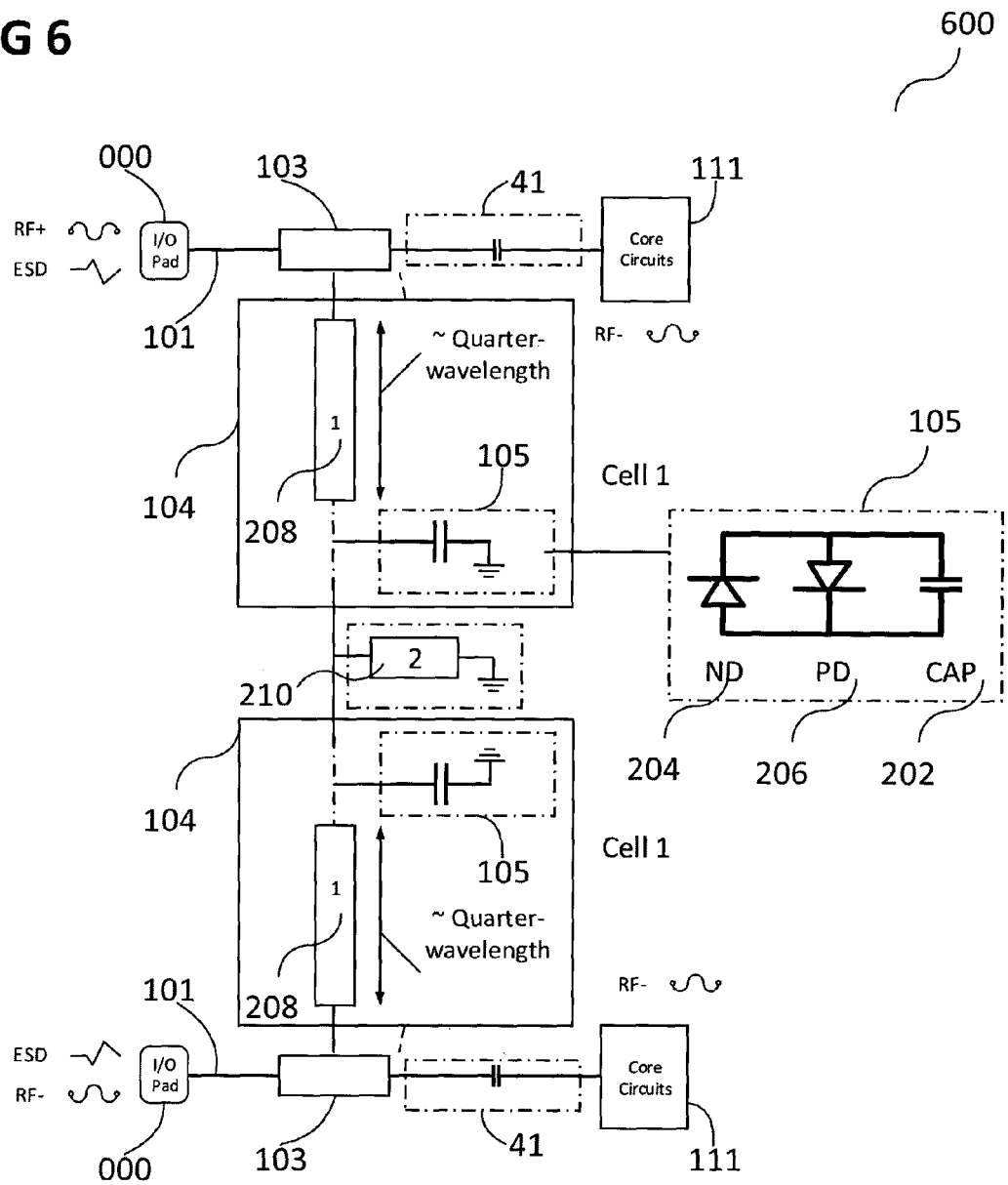
FIG. 6 shows a transmission line ESD protection network for differential drive signals in accordance with an embodiment.

FIG. 1 shows a diagram 100 illustrating an application of the proposed ESD protection network in accordance with various embodiments. FIG. 1 shows an embodiment of the ESD protection scheme using the ESD protection network 88 based on the miniature passive or ESD protection embedded pad in accordance with various embodiments. The passive structure may be composed of ESD protected cells: examples like one or multiple cells shown in FIG. 2 or one or multiple cells shown in FIG. 3. The I/O pads may be co-designed with the ESD protection structures named as ESD embedded RF pads examples as shown in FIG. 5 and FIG. 6. To implement ESD protection against ESD stress between the I/O pad 000 and power supply rail VDD, a conventional supply clamp 66 may be utilized. The ESD protection network 88 and the supply clamp 66 may constitute a complete ESD protection network 33 capable of protecting the core circuits 111 against both positive and negative ESD stress between the I/O pad 000 and ground, between I/O pad 000 and VDD and between VDD and ground. The miniature passive structure 88 may also be connected between the wire connection 101 or power supply rail VDD, in which case the ESD stress between the I/O pad 000 and the core circuits may be handled by the ESD protection network 88 to ground, while the ESD stress between the output pad similar to 000 but in output and the ESD stress from output pad may be handled by the ESD protection network 88 connected in the output with similar configuration like input and the supply clamp 66.

Figure 2:
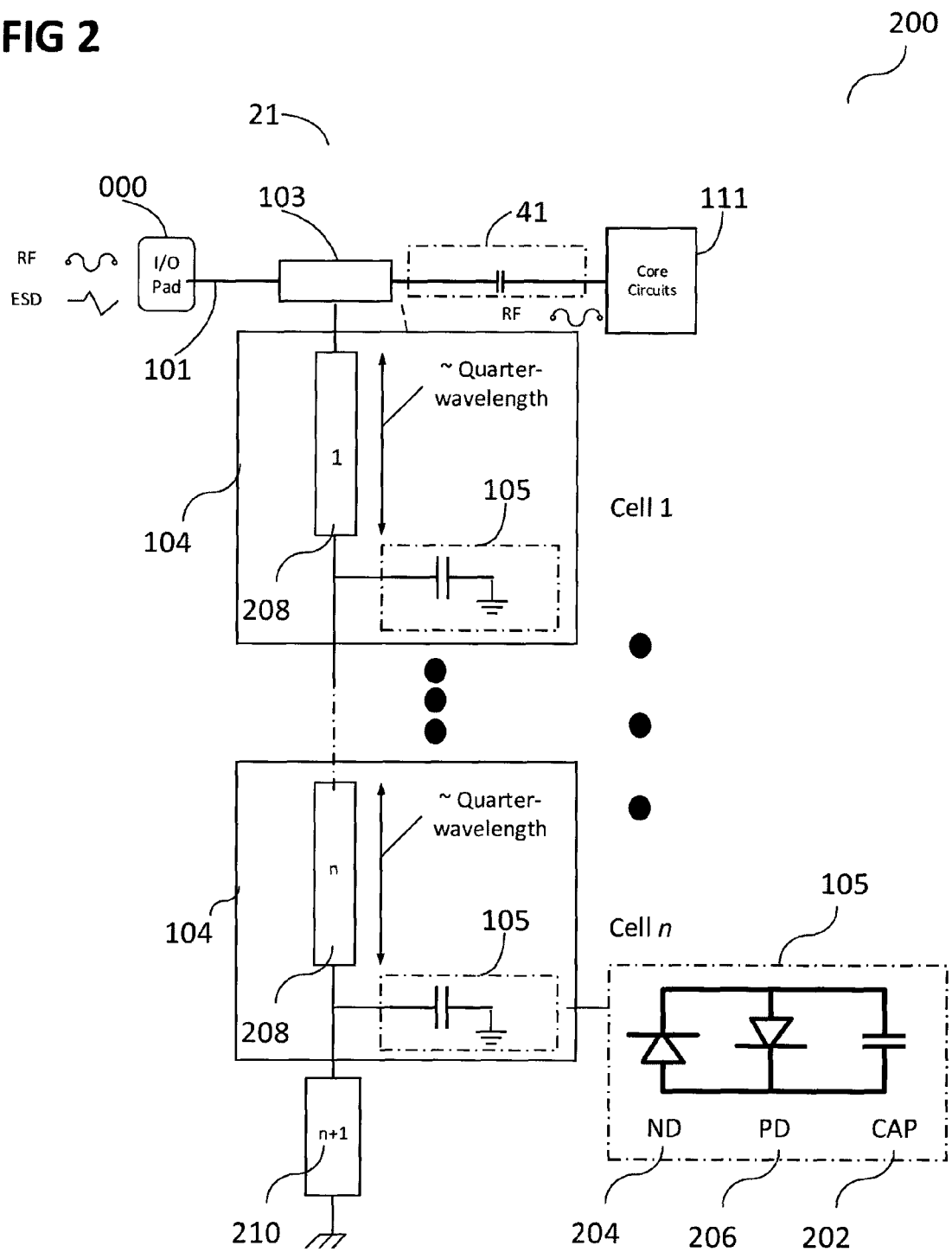
FIG. 2 shows a transmission line type ESD protection network in accordance with an embodiment.

FIG. 2 shows a general transmission line type ESD protection network 200 in accordance with an embodiment. The state before the ESD protection network 200 with RF or ESD signal injection may be denoted as state S1, while the state after the ESD protection network may be denoted as state SN. Both the RF and the ESD signal may travel toward the core circuits 111 through the wire connection 101 once they are applied on to the I/O Pad 000. However, the dominant ESD signal may bypass through the ESD protection network 88 in FIG. 1. The ESD protection network 200 may introduce high impedance loaded or unloaded transmission line 208 with length around quarter-wavelength 1 with connection of capacitor type network 105, which may be capacitor/capacitors 202, or capacitor 202 connected in parallel with positive connection diode (PD) 204 or negative connection diode (ND) 206 or both ND 204 and PD 206 in shunt to form a cell 104. The cascading of the multiple cells 104 up to n stages with a high impedance section n+1 (where is integer start from 1) 210 may form a general case of the ESD protection network 200 as shown in FIG. 2. The cell number, physical dimension, position and spacing of the load lines may all be available design variables so that protection level and RF bandwidth and impedance match conditions may be designed to the desirable value in the I/O port. The ESD protection structure 21 composed of the transmission line 103, the transmission lines or loaded transmission lines 208 in 105, may couple the RF energy to the core circuits 111 using a coupling capacitor 41 which may block DC voltage of the core circuits 111 from leaking to ground while couples the RF signal to the core circuits 111. The capacitor 41 may be replaced by a wire to the core circuits 111. As shown in FIG. 2, while the RF and ESD signal may be injected to the I/O pad 000, the RF signal may travel through the ESD protection network and the coupling capacitor and feed to the core circuits 111 through the wire connection with low loss. The ESD signal may be efficiently bypassed to ground by the ESD protection network 88 and may cause no damage to the core circuits 111.

Figure 3:
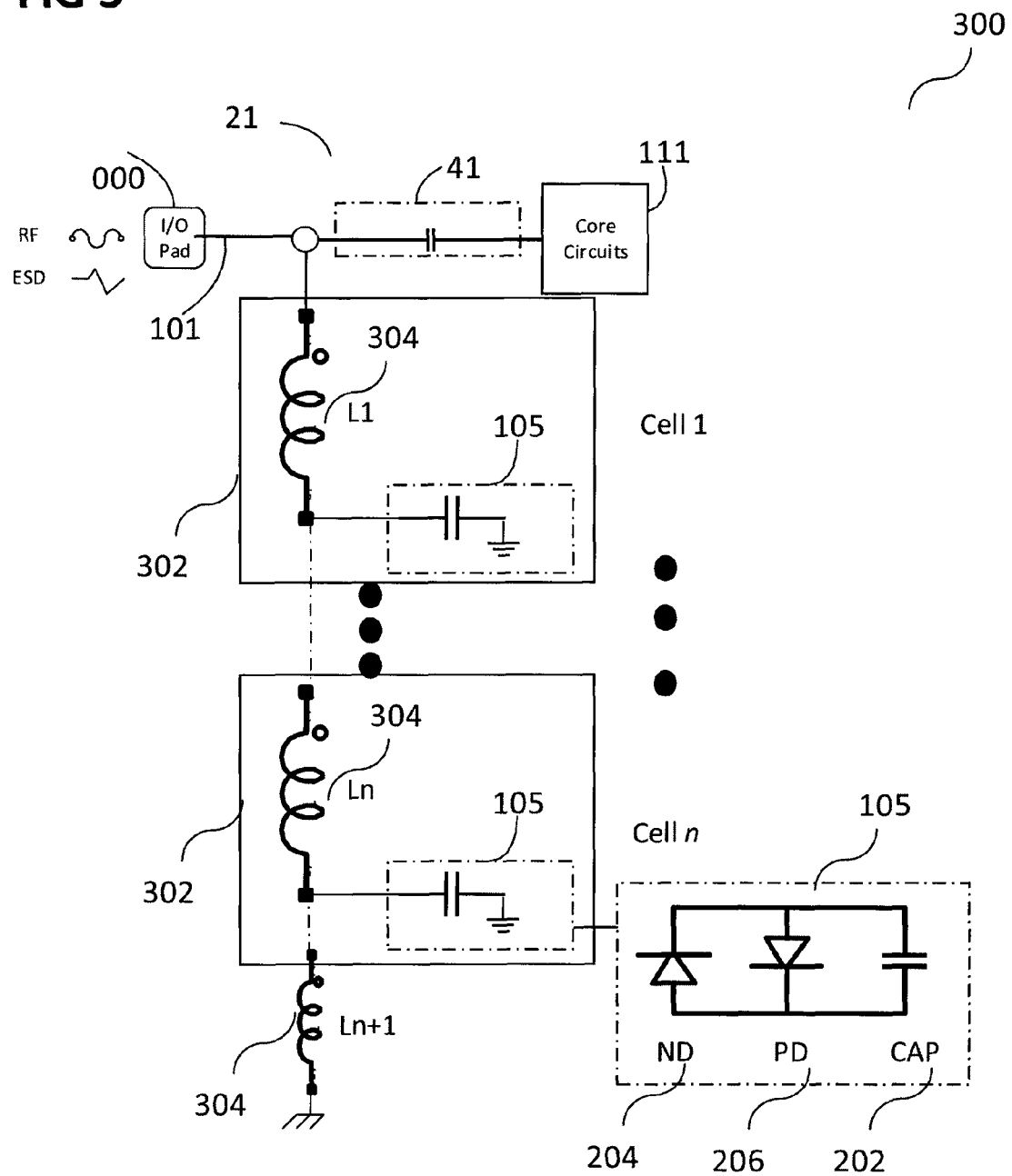
FIG. 3 shows a lumped element type ESD protection network in accordance with an embodiment.

FIG. 3 shows a general lumped element type ESD protection network 300 in accordance with various embodiments. The state before the ESD protection network 300 with RF or ESD signal injection may be denoted as state S1, while the state after the ESD protection network 300 may be denoted as state SN. Both the RF and the ESD signal may travel toward the core circuits 111 through the wire connection 101 once they are applied on to the I/O Pad 000. However, the dominant ESD signal may bypass through the ESD protection network 88 in FIG. 1. The ESD protection network 300 may introduce one or more inductors L 304 with connection of capacitor type network 105, which may be a capacitor 202 or a ND diode 204, PD diode 206 or both ND 204 and PD diodes 206 with one or several capacitors, in shunt to form a cell 302. The cascading of the multiple cells 302 up to n stages with an inductor Ln+1 304 (where is integer start from 1) may form a general case of the ESD protection network 300 as shown in FIG. 3. The cell number, inductor and capacitor values, may all be available design variables so that protection level and RF bandwidth and impedance match conditions may be designed to the desirable value in the I/O port. The ESD protection structure 21, composed of the transmission line 103, and the inductor(s) 304 in 302 may couple the RF energy to the core circuits 111 using a coupling capacitor 41 which may block DC voltage of the core circuits 111 from leaking to ground while couples the RF signal to the core circuits 111. The capacitor 41 may be replaced by a wire to the core circuits 111. As shown in FIG. 3, while the RF and ESD signal are injected to the I/O pad 000, the RF signal may travel through the ESD protection network and the coupling capacitor and feed to the core circuits 111 through the wire connection with low loss. The ESD signal may be efficiently bypassed to ground by the ESD protection network 88 and cause no damage to the core circuits 111.

Figure 4:
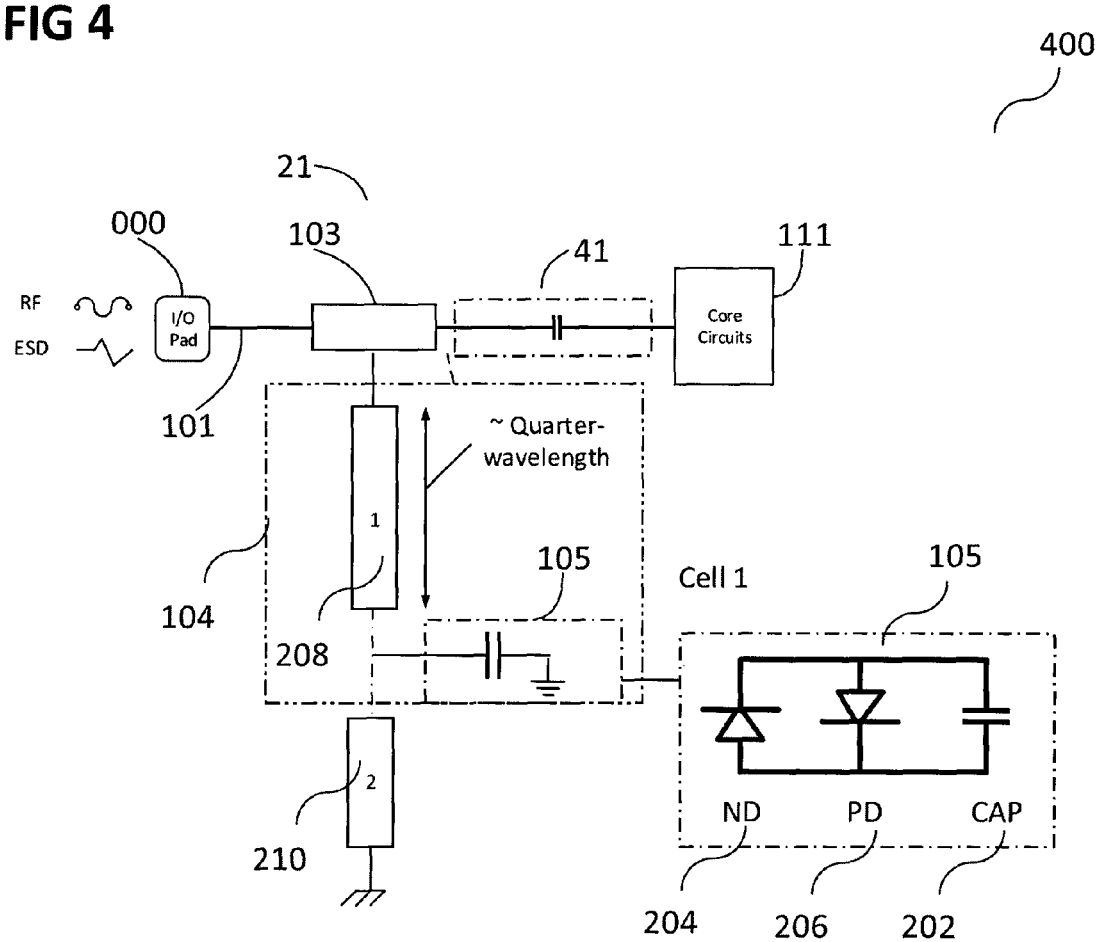
FIG. 4 shows a transmission line type ESD protection network in accordance with an embodiment.

FIG. 4 shows a compact transmission line type ESD protection network 400 in accordance with various embodiments. FIG. 4 illustrates a special case for the general ESD protection network in FIG. 2. Only one cell 208, i.e. Cell 1 may be used. The high impedance transmission line n+1=2 (210) may be shunt to ground at the other end. The injected RF and ESD signal may be input from the I/O pads through connection lines 101. The RF signal may pass through the transmission line 103, which may be a transmission line T-junction to 41 or a short line to the core circuits and almost no RF signal leak to Cell 1 in the ESD protection network may occur, while the ESD signal may be dumped to the ESD protection network and almost no leakage may occur through the core circuit 111.

FIG. 5 shows a lumped-element type ESD protection network 500 in accordance with various embodiments. FIG. 5 illustrates a special case for the general ESD protection network in FIG. 3. Only one cell 302, i.e. Cell 1, may be formed by inductor 304 L1 shunted connected with capacitor network as described above. The inductor n+1=2 (304) may be shunt to ground at the other end. The injected RF and ESD signal may be input from the I/O pads through connection lines 101. The RF signal may pass through the transmission line 103, which may be a transmission line T-junction or wire connection to 41 or a short line to the core circuits, and almost no RF signal leak to Cell 1 in the ESD protection network may occur, while the ESD signal may be dumped to the ESD protection network and almost no leakage may occur through the core circuit 111.

FIG. 6 shows a transmission line ESD protection network 600 for differential drive signals in accordance with various embodiments. FIG. 6 illustrates a special case for the general ESD protection network for differential drive circuits or network. Only two cells 104 i.e. two copies of Cell 1 (but the values may be different or the same) may be used for the positive path and the negative path. One end of the high impedance transmission line n+1=2 (210) may be connected with the Cell 1 and the other end may be shunt to ground at the other end. The injected RF+, RF− and ESD signal may be input from the two I/O pads through connection lines 101. The RF signal RF+ and RF− may pass through the transmission line 103, which may be a transmission line T-junction to 41 or a short line to the core circuits and almost no RF signal leak to Cell 1 (104) in the ESD protection network 600, may occur while the ESD signal may be dumped to the ESD protection network 600 and almost no leakage through the core circuit 111 may occur. Though in FIG. 6, only Cell 1 may be used for the ESD network, it may also be extended to multiple cell connection as referring to FIG. 2 for the multiple cells connection. The cell number may be doubled compared to the case of FIG. 2.

Figure 7:
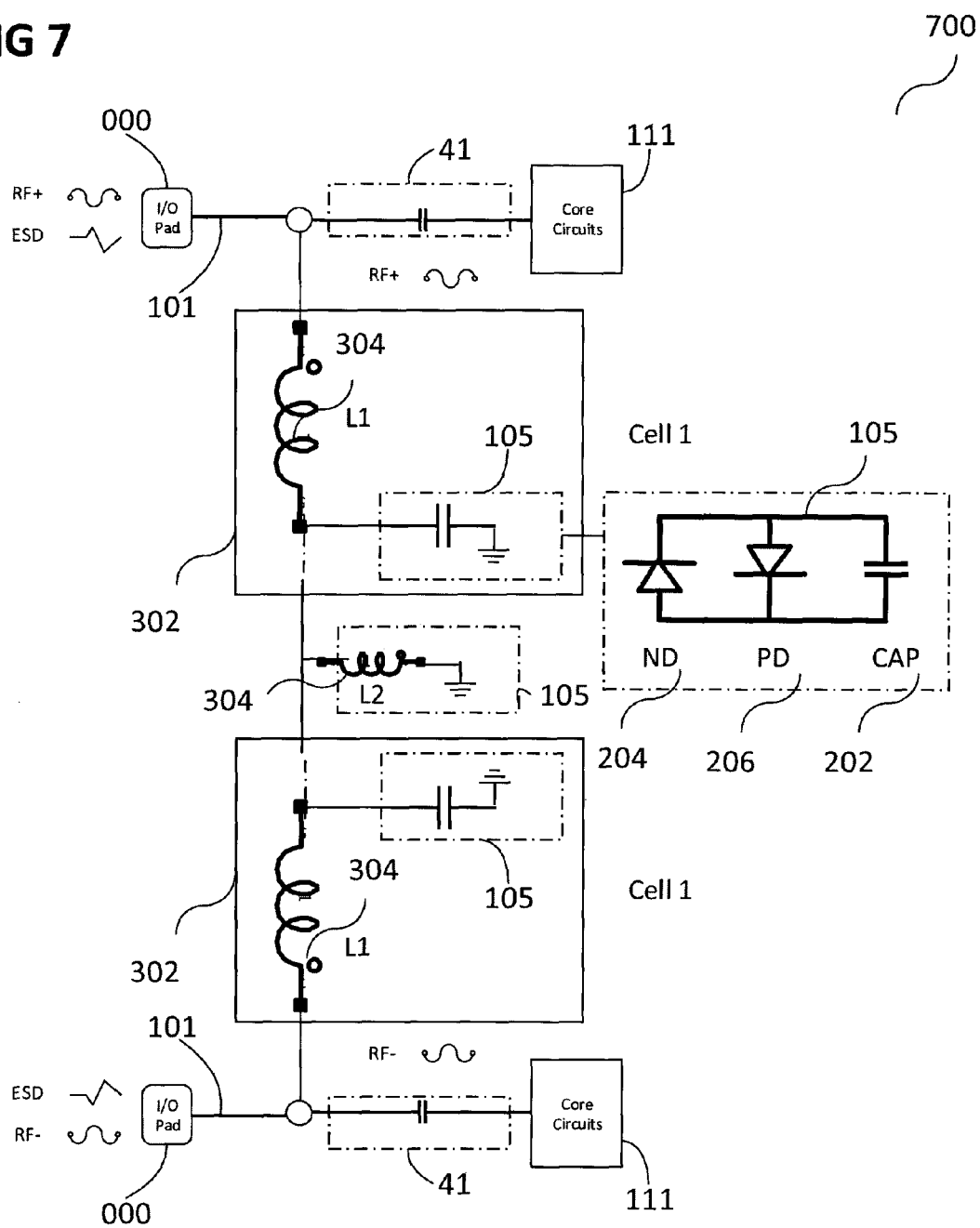
FIG. 7 shows a lumped-element ESD protection network for differential drive signals in accordance with an embodiment.

FIG. 7 shows a lumped-element ESD protection network 700 for differential drive signals in accordance with various embodiments. FIG. 7 illustrates a special case for the general ESD protection network for differential drive circuits or network. Only two cells 302 i.e. two copies of Cell 1 (but the values may be different or the same) may be used for the positive path and the negative path. One end of the inductor (302) Ln+1=L2 may be connected with the Cell 1 and the other end may be shunt to ground at the other end. The injected RF+, RF− and ESD signal may be input from the two I/O pads through connection lines 101. The RF signal RF+ and RF− may pass through the transmission line 103, which may be a transmission line T-junction or the wire connections to 41 or a short line to the core circuits, and almost no RF signal leak to Cell 1 may occur in the ESD protection network, while the ESD signal may be dumped to the ESD protection network and almost no leakage may occur through the core circuit 111. Though in FIG. 7, only two Cells #1 (302) are used for the ESD network, it may be also be extended to multiple cell connection as referring to FIG. 3 for the multiple cells connection. The cell number may be doubled compared to the case of FIG. 3.

Figure 8:
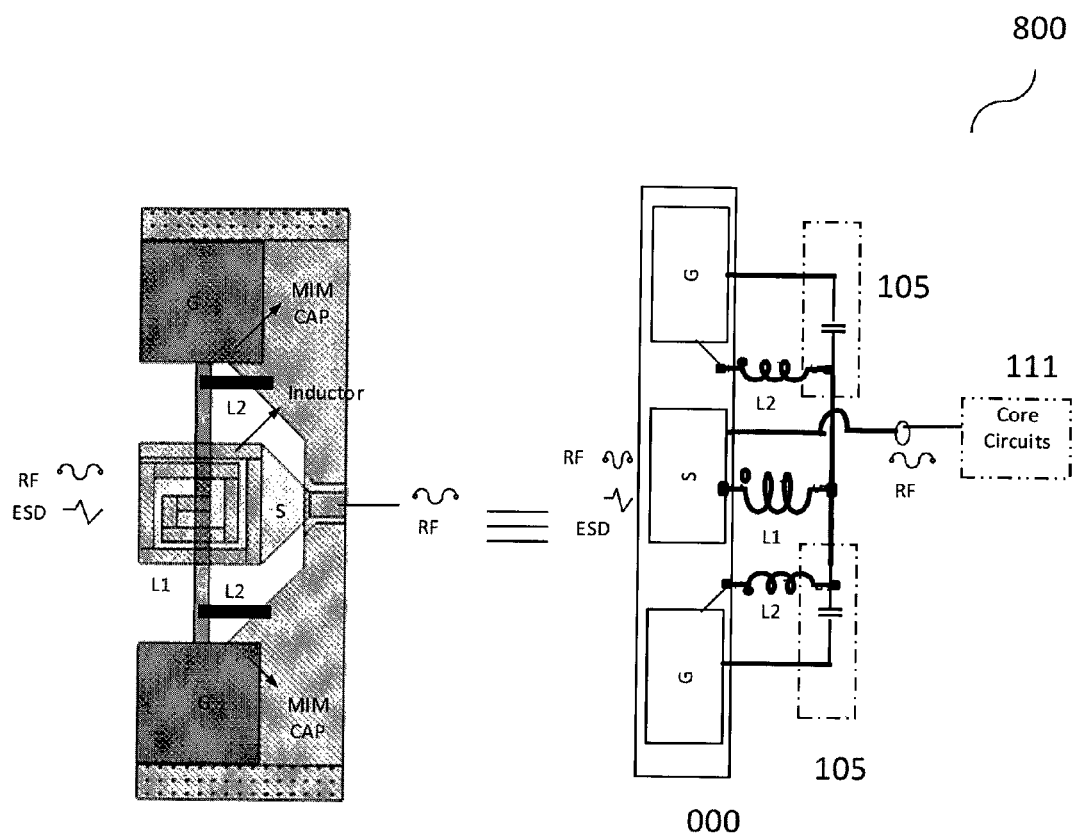
FIG. 8 shows ESD protected GSG Pads and a corresponding simplified equivalent model in accordance with an embodiment.

FIG. 8 shows an illustration 800 of ESD protected GSG pads and a corresponding simplified equivalent model. FIG. 8 illustrates a special case for the general ESD protection network to be implemented or embedded into the GSG pads. The spiral inductor which may be of any shape, single layer or multilayer stacking according to a process, may be implemented below the "S" pads (signal pads) and connected to "S" pad at one end and the other end may be connected to a capacitor, which may be implemented under the ground pads "G" or may use the MIM (Metal-Insulator-Metal) or other type of capacitor. The other end of the capacitor opposite the end connected with L1 may be connected to the ground. The inductor L2 may be a spiral or straight line connected with L1 in one end and the other end can directly be shorted to the ground. The equivalent circuit model is shown in FIG. 8. It can be seen that two cells i.e. two copies of Cell 1 (but the values may be different or the same) may be used for two paths connected from the signal pad to the ground pads through L1 and L2 and the capacitor network 105. One end of the inductor Ln+1=L2 may be connected with the Cell 1 and the other end may be shunt to ground at the other end. The injected RF and ESD signal may be input from the I/O pads. The RF signal may directly pass through the S pad to the core circuits or may be connected with a capacitor like 41 like described above. By doing so, almost no RF signal may leak to Cell 1 in the ESD protection network, while the ESD signal may be dumped to the ESD protection network and almost no leakage may occur through the core circuit.

Figure 9:
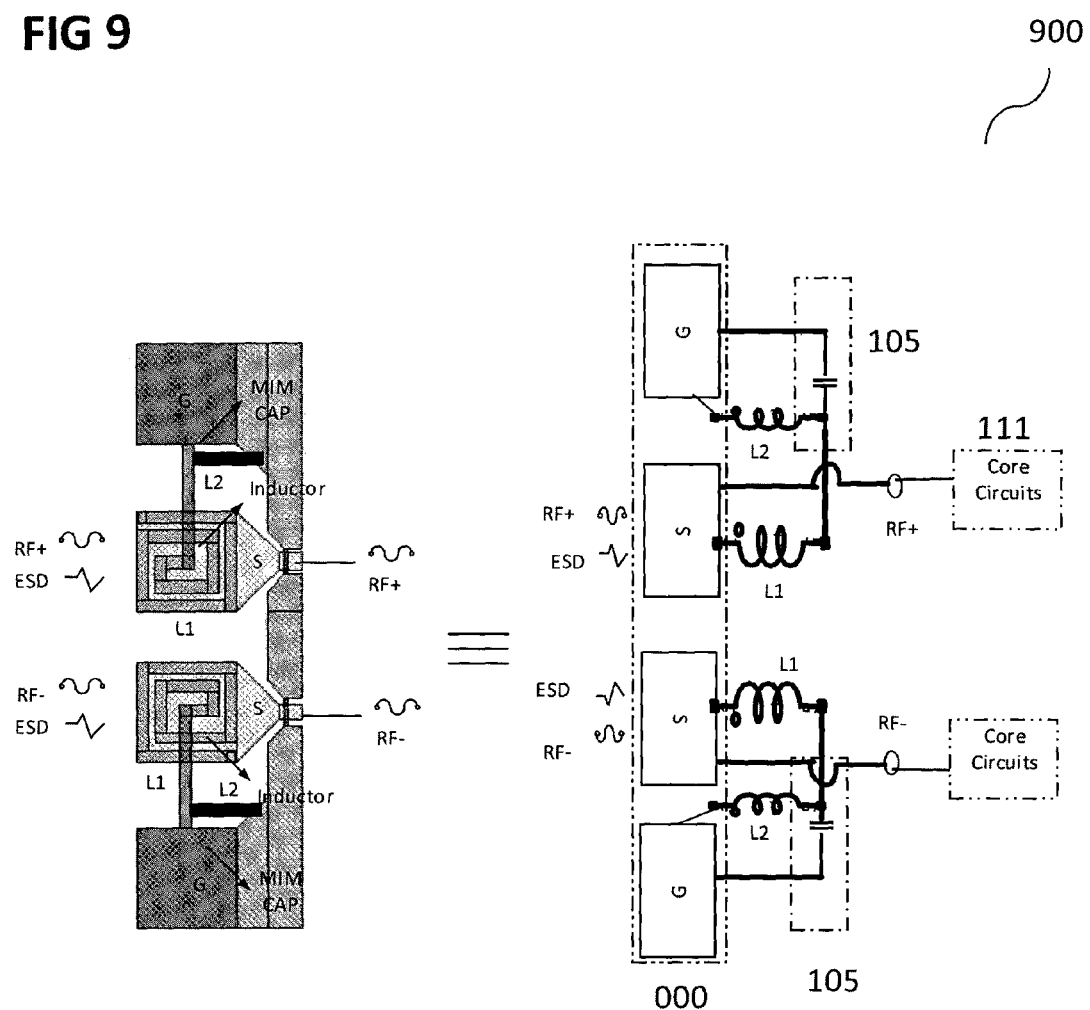
FIG. 9 shows ESD protected GSSG Pads and a corresponding simplified equivalent model in accordance with an embodiment.

FIG. 9 shows an illustration 900 of ESD protected GSSG Pads and a corresponding simplified equivalent model. FIG. 9 illustrates a special case for the general ESD protection network to be implemented or embedded into the GSSG pads. The spiral inductor, which may be any shape, single layer or multilayer stacking according to a process, may be implemented below the "S" pads and connected to "S" pad at one end and the other end may be connected to a capacitor, which may be implemented under the ground pads "G" or may use the MIM or other type of capacitor. The other end of the capacitor opposite the end connected with L1 may be connected to the ground. The inductor L2 may be a spiral or straight line connected with L1 in one end and the other end may directly be shorted to the ground. The equivalent circuit model is shown in FIG. 9. It may be seen that two cells i.e. two copies of Cell 1 (but the values may be different or the same) may be used for two paths connected from the signal pad to the ground pads through L1 and L2 and the capacitor network 105. One end of the inductor Ln+1=L2 may be connected with the Cell 1 and the other end may be shunt to ground at the other end. The injected RF and ESD signal may be input from the I/O pads. The RF signal may directly pass through the S pad to the core circuits or may be connected with a capacitor like described above. By doing so, almost no RF signal may leak to Cell 1 in the ESD protection network, while the ESD signal may be dumped to the ESD protection network and almost no leakage may occur through the core circuit.

Figure 10A:
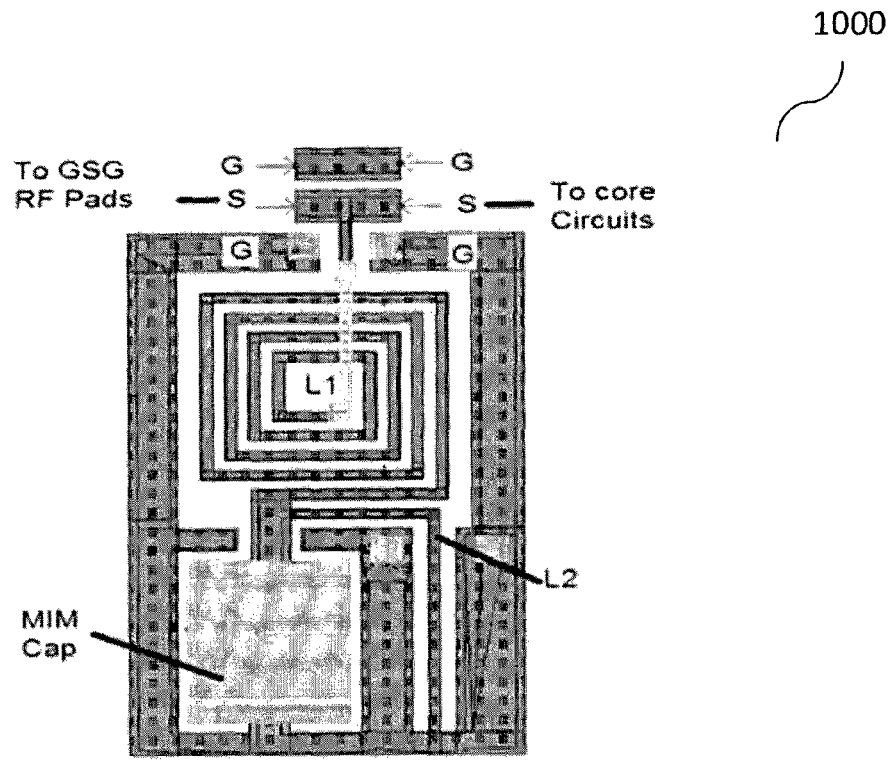
FIG. 10 shows a layout in a commercial SiGe process and simulation results in accordance with an embodiment.
Figure 10B:
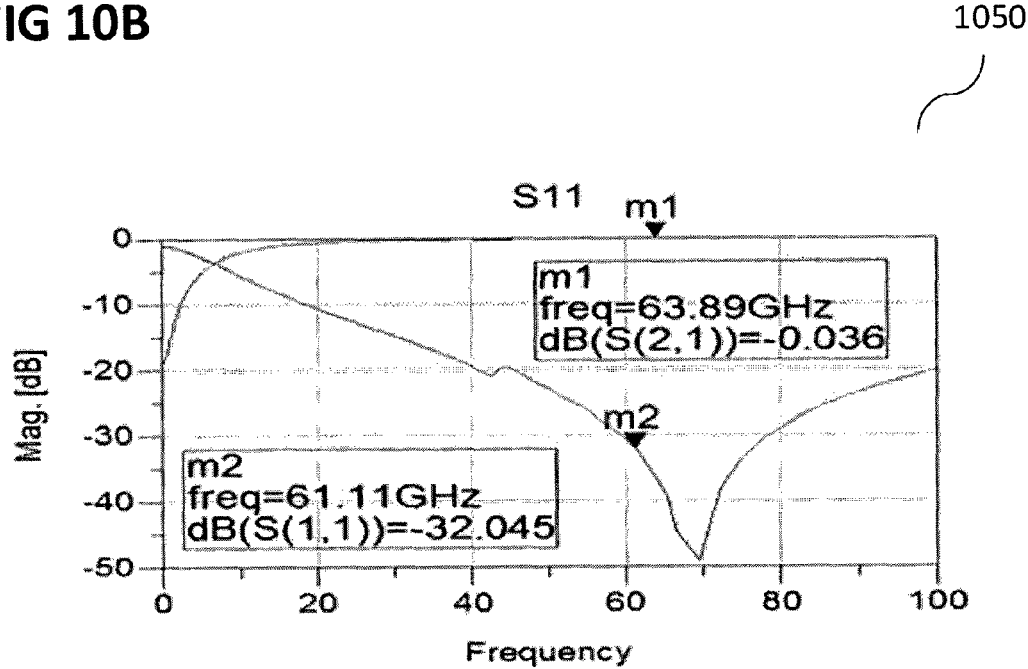

FIGS. 10A and 10B show one implemented example of ESD in SiGe BiCMOS Tower Jazz process according to various embodiments. FIG. 10A shows a layout 1000 in a commercial SiGe Process. FIG. 10B shows a diagram 1050 illustrating simulation results. FIG. 10A and FIG. 10B illustrate a case of ESD protection network designed for 60 GHz RF transceiver. All of the configuration or transmission lines may be designed based on conductor-backed coplanar-waveguide (CBCPW). The spiral inductor, which may be of any shape, may be implemented beside the main signal line and connected through a T-junction. The self build MIM cap (capacitor) or cap from the foundry may be designed by using several metal layers from metal 1 to metal 6 based on the used process. The inductor L2 may be designed by using a CBCPW straight line with one end connected to the MINI CAP and inductor L1, and the other end may be connect to the ground. As the simulation of the two port with one input port from GSG pads and the other port denoted as GSG to the core circuits, the RF signal may pass through with low insertion loss while the low frequency ESD interference may be bypassed to the ground of the system. There may also be a stopband for the ESD circuits according to various embodiments, which may be used to reject certain frequency like harmonic frequencies of the fundamental signal.

According to various embodiments, the technical features of the various embodiments may be as described above and described below.

According to various embodiments, a series of miniature passive structures for ESD protection and I/O matching of high frequency integrated circuits may be provided, for example like described referring to FIG. 2 and FIG. 3, including one or several high impedance transmission lines or loaded transmission lines with electric length of around quarter-wavelength with one-end connected in shunt to the main signal line, signal pad or the another stage of high impedance line and one or several capacitor network connected in shunt to the other end of the high impedance line, providing ESD current bypassing paths; and/or one or several inductors, transformers or any shapes of the inductors with one-end connected in shunt to the main signal line, signal pad or the another stage inductor and one or several capacitor network connected in shunt to the other end of the inductor, providing ESD current bypassing paths.

According to various embodiments, the first stage of high impedance transmission line or loaded transmission line with the electric length of around quarter-wave length may be connected to the signal line on one end and the other end may be connected to the capacitor networks and another stage/section of high impedance transmission line (this stage of impedance line may be any length).

According to various embodiments, the capacitor network 105, which may be connected to the high impedance transmission line/loaded lines or inductors, may be one or several capacitors only, or capacitors in parallel connected with one a several diodes or PN junction. The connection of the diode or several diodes to the high impedance transmission line or inductors may be positive side or negative side or both positive and negative i.e. anti-parallel connections.

According to various embodiments, the n+1 stage high-impedance transmission line may be replaced by the capacitor network 105 or high-impedance transmission line connected with the capacitor network 105 in one end while the other end of the capacitor network is connected to the ground.

According to various embodiments, the n+1 stage inductor Ln+1 may be replaced by the capacitor network 105 or inductor Ln+1 connected with the capacitor network 105 in one end while the other end of the capacitor network may be connected to the ground.

According to various embodiments, the core circuits to be protected as application, for example like shown in FIG. 1, may be any circuits like LNA (low noise amplifier), Mixer, Pa. (power amplifier) or system like receiver, transmitter, or transceiver, which may have the matching or ESD protection requirements.

According to various embodiments, the high impedance transmission line/loaded line or inductor shunted connected with a capacitor network may form a cell. The ESD protection circuits may be one cell or multiple cell cascading connected with another stage high impedance line or inductor to the ground.

According to various embodiments, the high impedance transmission lines/loaded lines can be but not limited to (i) a coplanar waveguide, (ii) a conductor backed coplanar waveguide, (iii) coax transmission lines, (iv) a microstrip line, or (v) a stripline, wherein the transmission lines with periodic or non-periodic loading using single layer of multilayer process.

According to various embodiments, the inductor as described above may be (but may not be limited to) a lumped inductor, an on-chip spiral inductor of any shapes, an on-chip differential drive inductor, or an on-chip multiple layer stacked inductor.

According to various embodiments, for the both I/O match consideration and ESD protection, the high impedance section line as described above may be not with electric length of a quarter-wavelength. It may be used to adjust I/O matching simultaneously with wideband ESD protection.

According to various embodiments, for the lumped LC (inductor, capacitor) cell ESD protection, the inductor and capacitor network values may be different from cell to cell. The design of different value of inductors or capacitor values may be to achieve different RF bandwidth requirement and different ESD protection level. It may be used to adjust I/O matching from RF input port to the core circuits simultaneously with wideband ESD protection.

According to various embodiments, the ESD protection structure may be cascaded to be multiple sections between the input pad and the core circuit to further improve the ESD protection capability.

The pads like DC pad, RF GSG pads etc. may be desired for the on-chip measurement or IC packaging. According to various embodiments, the ESD protection network may be implemented under the signal pads i.e. S pad, as the case implemented for the ESD protected GSG pads (as the example case in FIG. 8) or GSSG pads and example case in FIG. 9. But it may not be limited to above two RF pads, it may be also be implemented in any other type of the pads like the GSGSG, GSSGSSG pads.

According to various embodiments, a high frequency ESD protection network for integrated circuits based on different IC technologies such as CMOS, GaAs, SiGe, InP may be provided.

According to various embodiments, all of the inductors described herewith may be any shapes like circular, square, single-ended or differential drive. It may be single layer inductor, multilayer stacked inductor for area saving or a straight or any other shape high impedance transmission lines.

According to various embodiments, all of the capacitors described herewith may be of any shape like MIM CAP, interdigital CAP or multilayer MIM or interdigital CAP. The layer number or shape may be changed according to the process or the size or locations.

While the present invention has been illustrated and described using several specific embodiments, the illustrations and descriptions are not to be construed as limiting the scope of the invention. Various modifications may occur to those skilled in the art without departing from the true spirit and scope of the invention as claimed as follows.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A miniature passive structure for electrostatic discharge protection and input/output matching for a high frequency integrated circuit, the structure comprising:
    a transmission line for providing at least one electrostatic discharge path; and
    a capacitor with a first end connected to the transmission line and a second end connected to ground;
    wherein the transmission line comprises an unloaded transmission line.

2. The miniature passive structure of claim 1, wherein the transmission line comprises a length of about ¼ wavelength.

3. The miniature passive structure of claim 1 further comprising:
    an input signal trace, wherein the transmission line is DC connected to the input signal trace at a first end and DC connected to the capacitor at a second end.

4. The miniature passive structure of claim 1, further comprising:
    an input signal trace, wherein the transmission line is DC connected to the input signal trace at a first end and DC connected to the capacitor at a second end.

5. The miniature passive structure of claim 1,
    wherein the transmission line comprises a high impedance transmission line;
    wherein the high impedance transmission line comprises at least one of (i) a coplanar waveguide, (ii) a conductor backed coplanar waveguide, (iii) coax transmission lines, (iv) a microstrip line, or (v) a stripline.

* * * * *